United States Patent
Hayakawa et al.

(10) Patent No.: US 11,101,079 B2
(45) Date of Patent: Aug. 24, 2021

(54) SOLAR CELL AND SOLAR CELL MANUFACTURING METHOD

(71) Applicant: SEKISUI CHEMICAL CO., LTD., Osaka (JP)

(72) Inventors: Akinobu Hayakawa, Osaka (JP); Mayumi Horiki, Osaka (JP); Shunji Ohara, Osaka (JP); Tomohito Uno, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 516 days.

(21) Appl. No.: 15/545,774

(22) PCT Filed: Jan. 29, 2016

(86) PCT No.: PCT/JP2016/052637
§ 371 (c)(1),
(2) Date: Jul. 24, 2017

(87) PCT Pub. No.: WO2016/121922
PCT Pub. Date: Aug. 4, 2016

(65) Prior Publication Data
US 2018/0019066 A1    Jan. 18, 2018

(30) Foreign Application Priority Data

Jan. 29, 2015 (JP) .............................. JP2015-015816
Mar. 20, 2015 (JP) .............................. JP2015-058422
Mar. 20, 2015 (JP) .............................. JP2015-058425

(51) Int. Cl.
*H01G 9/20* (2006.01)
*H01L 51/00* (2006.01)
*H01L 51/42* (2006.01)

(52) U.S. Cl.
CPC ....... *H01G 9/2009* (2013.01); *H01L 51/0077* (2013.01); *H01L 51/4213* (2013.01);
(Continued)

(58) Field of Classification Search
CPC .............. H01G 9/2009; H01L 51/0077; H01L 51/4213; H01L 51/0004; Y02P 70/521; Y02E 10/549
See application file for complete search history.

(56) References Cited

U.S. PATENT DOCUMENTS

2010/0255344 A1    10/2010    Kim et al.
2015/0228415 A1    8/2015    Seok et al.
2017/0148579 A1*  5/2017    Snaith ................ C23C 14/0021

FOREIGN PATENT DOCUMENTS

CN    103046132    4/2013
CN    104157787    11/2014
(Continued)

OTHER PUBLICATIONS

JP2014-236045A1, Machine Translation, Ohara (Year: 2014).*
(Continued)

*Primary Examiner* — Devina Pillay
(74) *Attorney, Agent, or Firm* — Wenderoth, Lind & Ponack, L.L.P.

(57) ABSTRACT

The present invention aims to provide a solar cell in which a decrease in photoelectric conversion efficiency due to continuous exposure to light (photodegradation) is reduced, and a method of producing the solar cell. The present invention relates to a solar cell, including: an electrode; a counter electrode; and a photoelectric conversion layer between the electrode and the counter electrode, the photoelectric conversion layer containing an organic-inorganic perovskite compound represented by the formula R-M-X₃ where R is an organic molecule, M is a metal atom, and X is a halogen atom or a chalcogen atom, the solar cell satisfying the formula (1):

$$N(T,I)/N(0,I)<5 \qquad (1)$$

(Continued)

where $N(0, I)$ is a carrier density of the organic-inorganic perovskite compound immediately after start of exposure of the solar cell to light at an intensity of I mW/cm$^2$, and $N(T, I)$ is the carrier density of the organic-inorganic perovskite compound after continuous exposure of the solar cell to light at an intensity of I mW/cm$^2$ for T hour/hours.

7 Claims, 1 Drawing Sheet

(52) U.S. Cl.
CPC ......... *H01L 51/0004* (2013.01); *Y02E 10/549* (2013.01); *Y02P 70/50* (2015.11)

(56) References Cited

FOREIGN PATENT DOCUMENTS

| | | |
|---|---|---|
| EP | 2 924 755 | 9/2015 |
| EP | 3 924 755 | 9/2015 |
| JP | 2006-344794 | 12/2006 |
| JP | 2014-236045 | 12/2014 |
| JP | 2014236045 A * | 12/2014 |
| JP | 2015-56430 | 3/2015 |
| JP | 2015-138822 | 7/2015 |
| JP | 2015-191913 | 11/2015 |
| WO | 2013/049606 | 4/2013 |
| WO | 2014/042449 | 3/2014 |
| WO | 2014/045021 | 3/2014 |

OTHER PUBLICATIONS

International Preliminary Report on Patentability dated Aug. 1, 2017 in International (PCT) Application No. PCT/JP2016/052637.

Eperon et al., "Formamidinium lead trihalide: a broadly tunable perovskite for efficient planar heterojunction solar cells", Energy & Environmental Science, 2014, pp. 982-988.

Koh et al., "Formamidinium-Containing Metal-Halide: An Alternative Material for Near-IR Absorption Perovskite Solar Cells", The Journal of Physical Chemistry, vol. 118, No. 30, 2014, pp. 16458-16462.

Cimaroli et al., "Characterization of Ion-Assisted, Coevaporated $CH_3NH_3PI_3$ Thin Films", Photovoltaic Specialist Conference (PVSC), 2014, pp. 1522-1524.

Lee et al., "Efficient Hybrid Solar Cells Based on Meso-Superstructured Organometal Halide Perovskites", Science, vol. 338, 2012, pp. 643-647.

Reese et al., "Photoinduced Degradation of Polymer and Polymer-Fullerene Active Layers: Experiment and Theory", Advanced Functional Materials, vol. 20, 2010, pp. 3476-3483.

Miyasaka et al., "Perovskite Hakumaku Taiyo Denchi no Kaihatsu to Saishin Gijutsu", Gijutsu Kyoiku Shuppan Yugen Kaisha, 2014, pp. 118-123.

International Search Report dated Apr. 19, 2016 in International (PCT) Application No. PCT/JP2016/052637.

Extended European Search Report dated Sep. 26, 2018 in counterpart European Application No. 16743525.4.

Julian Burschka et al., "Sequential deposition as a route to high-performance perovskite-sensitized solar cells", Nature, vol. 499, no. 7458, pp. 316-319 (2013).

Edoardo Mosconi et al., "Electronic and optical properties of mixed Sn-Pb organohalide perovskites: a first principles investigation", Journal of Materials Chemistry A, vol. 3, No. 7, pp. 9208-9215 (2015).

Dualeh et al., "Effect of Annealing Temperature on Film Morphology of Organic-Inorganic Hybrid Perovskite Solid-State Solar Cells", Advanced Functional Materials, vol. 24, pp. 3250-3258, 2014.

Office Action dated Jun. 16, 2021 in European Patent Application No. 16 743 525.4.

David B. Mitzi, "Solution-processed inorganic semiconductors", Journal of Materials Chemisuy, 2004, vol. 14, pp. 2355-2365.

* cited by examiner

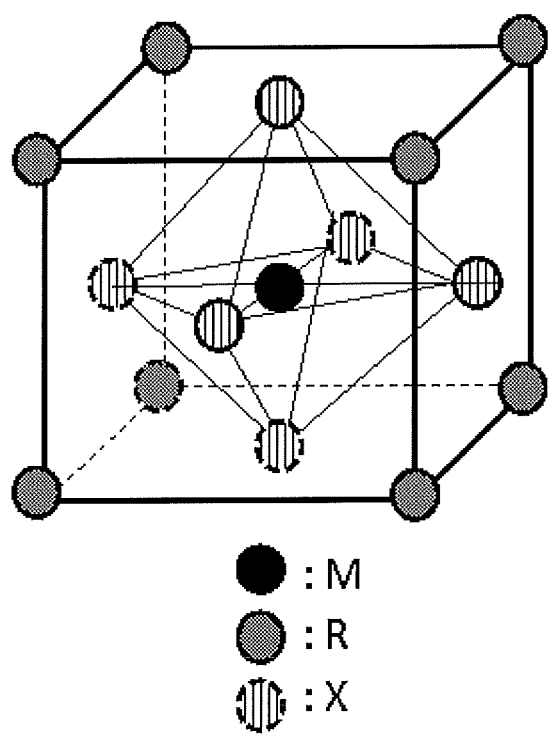

SOLAR CELL AND SOLAR CELL MANUFACTURING METHOD

TECHNICAL FIELD

The present invention relates to a solar cell in which a decrease in photoelectric conversion efficiency due to continuous exposure to light (photodegradation) is reduced, and a method of producing the solar cell.

BACKGROUND ART

Photoelectric conversion elements equipped with a laminate having an N-type semiconductor layer and a P-type semiconductor layer disposed between opposing electrodes have been conventionally developed. Such photoelectric conversion elements generate photocarriers by photoexcitation so that electrons and holes move through the N-type semiconductor and the P-type semiconductor, respectively, to create an electric field.

Most photoelectric conversion elements currently in practical use are inorganic solar cells which are produced using inorganic semiconductors such as silicon. The inorganic solar cells, however, have limited application because they are costly to produce and difficult to upsize. Therefore, organic solar cells produced using organic semiconductors instead of inorganic semiconductors have received attention.

Fullerene is used in most organic solar cells. Fullerene is known to function mainly as an N-type semiconductor. For example, Patent Literature 1 discloses a semiconductor heterojunction film formed using an organic compound serving as a P-type semiconductor, and fullerene. Fullerene, however, is known to be responsible for degradation of organic solar cells produced using fullerene (see e.g., Non-Patent Literature 1). Thus, there is a demand for an alternative material to fullerene.

In recent years, photoelectric conversion materials have been found that have a perovskite structure with lead, tin, or the like as the center metal. These materials, called hybrid organic-inorganic semiconductors, have been reported to have high photoelectric conversion efficiency (see Non-Patent Literature 2).

CITATION LIST

Patent Literature

Patent Literature 1: JP 2006-344794 A

Non-Patent Literature

Non-Patent Literature 1: Reese et al., Adv. Funct. Mater., 20, 3476-3483 (2010)

Non-Patent Literature 2: M. M. Lee et al., Science, 338, 643-647 (2012)

SUMMARY OF INVENTION

Technical Problem

The present invention aims to provide a solar cell in which a decrease in photoelectric conversion efficiency due to continuous exposure to light (photodegradation) is reduced, and a method of producing the solar cell.

Solution to Problem

The present invention relates to a solar cell, including: an electrode; a counter electrode; and a photoelectric conversion layer between the electrode and the counter electrode, the photoelectric conversion layer containing an organic-inorganic perovskite compound represented by the formula R-M-$X_3$ where R is an organic molecule, M is a metal atom, and X is a halogen atom or a chalcogen atom, the solar cell satisfying Formula (1) below:

$$N(T,I)/N(0,I)<5 \qquad (1)$$

where N(0, I) is a carrier density of the organic-inorganic perovskite compound immediately after start of exposure of the solar cell to light at an intensity of I mW/$cm^2$, and N(T, I) is the carrier density of the organic-inorganic perovskite compound after continuous exposure of the solar cell to light at an intensity of I mW/$cm^2$ for T hour/hours.

The present invention is described in detail below.

The present inventors considered the use of a specific organic-inorganic perovskite compound in the photoelectric conversion layer in a solar cell including an electrode, a counter electrode, and a photoelectric conversion layer between the electrode and the counter electrode. The use of an organic-inorganic perovskite compound is expected to improve the photoelectric conversion efficiency of the solar cell.

In solar cells with a photoelectric conversion layer containing an organic-inorganic perovskite compound, the photoelectric conversion efficiency is high immediately after the start of exposure to light; however, it has been newly revealed that the photoelectric conversion efficiency decreases when the solar cell is continuously exposed to light (photodegradation). The present inventors found out that a decrease in the photoelectric conversion efficiency due to continuous exposure to light (photodegradation) is reduced in a solar cell satisfying Formula (1) below:

$$N(T,I)/N(0,I)<5 \qquad (1)$$

where N(0, I) is the carrier density of the organic-inorganic perovskite compound immediately after start of exposure of the solar cell to light at an intensity of I mW/$cm^2$, and N(T, I) is the carrier density of the organic-inorganic perovskite compound after continuous exposure of the solar cell to light at an intensity of I mW/$cm^2$ for T hour/hours. They thus completed the present invention.

The solar cell of the present invention includes an electrode, a counter electrode, and a photoelectric conversion layer between the electrode and the counter electrode.

The term "layer" as used herein means not only a layer having a clear boundary, but also a layer having a concentration gradient in which contained elements are gradually changed. The elemental analysis of the layer can be conducted, for example, by FE-TEM/EDS analysis of the cross section of the solar cell to confirm the element distribution of a particular element. The term "layer" as used herein means not only a flat thin film-shaped layer, but also a layer capable of forming an intricate structure together with other layer(s).

The electrode and the counter electrode are each may be made of any material, and conventionally known materials may be used. The counter electrode is often a patterned electrode.

Examples of the materials of the electrode include fluorine-doped tin oxide (FTO), gold, silver, titanium, sodium, sodium-potassium alloys, lithium, magnesium, aluminum, magnesium-silver mixtures, magnesium-indium mixtures, aluminum-lithium alloys, Al/$Al_2O_3$ mixtures, and Al/LiF mixtures. Examples of the materials of the counter electrode include metals such as gold, conductive transparent materials such as CuI, indium tin oxide (ITO), $SnO_2$, aluminum zinc oxide (AZO), indium zinc oxide (IZO), gallium zinc oxide (GZO), and antimony-doped tin oxide (ATO), and conductive transparent polymers. These materials may be used alone or in combination of two or more thereof. The electrode and the counter electrode may each be either a cathode or an anode.

The photoelectric conversion layer contains an organic-inorganic perovskite compound represented by the formula R-M-X$_3$ where R is an organic molecule, M is a metal atom, and X is a halogen atom or a chalcogen atom.

The use of the organic-inorganic perovskite compound in the photoelectric conversion layer can improve the photoelectric conversion efficiency of the solar cell.

The R is an organic molecule and is preferably represented by C$_l$N$_m$H$_n$ (l, m, and n each represent a positive integer).

Specific examples of the R include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, imidazole, azole, pyrrole, aziridine, azirine, azetidine, azete, imidaszoline, carbazole, methylcarboxyamine, ethylcarboxyamine, propylcarboxyamine, butylcarboxyamine, pentylcarboxyamine, hexylcarboxyamine, formamidinium, guanidine, aniline, pyridine, and ions thereof (e.g., methylammonium (CH$_3$NH$_3$)), and phenethylammonium. Preferred among them are methylamine, ethylamine, propylamine, propylcarboxyamine, butylcarboxyamine, pentylcarboxyamine, formamidinium, guanidine, and ions thereof. More preferred are methylamine, ethylamine, pentylcarboxyamine, formamidinium, guanidine, and ions thereof. In particular, for a high photoelectric conversion efficiency, methylamine, formamidinium, and ions thereof are still more preferred.

The M is a metal atom. Examples thereof include lead, tin, zinc, titanium, antimony, bismuth, nickel, iron, cobalt, silver, copper, gallium, germanium, magnesium, calcium, indium, aluminum, manganese, chromium, molybdenum, and europium. In particular, lead or tin is preferred from the standpoint of electron orbital overlap. These metal atoms may be used alone or in combination of two or more thereof.

The X is a halogen atom or a chalcogen atom. Examples thereof include chlorine, bromine, iodine, sulfur, and selenium. These halogen atoms or chalcogen atoms may be used alone or in combination of two or more thereof. In particular, halogen atoms are preferred because the organic-inorganic perovskite compound containing halogen in the structure is soluble in organic solvents and is usable in inexpensive printing methods or the like. Iodine or bromine is more preferred, and iodine is still more preferred, because the organic-inorganic perovskite compound has a narrow energy band gap.

The organic-inorganic perovskite compound preferably has a cubic structure where the metal atom M is placed at the body center, the organic molecule R is placed at each vertex, and the halogen atom or chalcogen atom X is placed at each face center.

FIG. 1 is a schematic view illustrating an exemplary crystal structure of the organic-inorganic perovskite compound having a cubic structure where the metal atom M is placed at the body center, the organic molecule R is placed at each vertex, and the halogen atom or chalcogen atom X is placed at each face center. Although details are not clear, it is presumed that the direction of an octahedron in the crystal lattice can be easily changed owing to the structure; thus the mobility of electrons in the organic-inorganic perovskite compound is enhanced, improving the photoelectric conversion efficiency of the solar cell.

The solar cell of the present invention satisfies Formula (1) below:

$$N(T,I)/N(0,I)<5 \qquad (1)$$

where N(0, I) is the carrier density of the organic-inorganic perovskite compound immediately after (within one minute) start of exposure of the solar cell to light at an intensity of I mW/cm$^2$, and N(T, I) is the carrier density of the organic-inorganic perovskite compound after continuous exposure of the solar cell to light at an intensity of I mW/cm$^2$ for T hour/hours.

In the solar cell of the present invention, since the carrier density of the organic-inorganic perovskite compound satisfies Formula (1) above, a decrease in the photoelectric conversion efficiency due to continuous exposure to light (photodegradation) is reduced. It is sufficient that N(T, I)/N(0, I) is smaller than 5, but N(T, I)/N(0, I) is preferably smaller than 3, more preferably smaller than 2. The lower limit of N(T, I)/N(0, I) is not particularly limited, and is usually 1 or greater.

The carrier density (N(0, I) and N(T, I)) of the organic-inorganic perovskite compound can be determined by a method such as absorption spectroscopy, photoelectron spectroscopy, or C-V measurement. Specifically, for example, the carrier density of the organic-inorganic perovskite compound can be determined by conversion to a Mott-Schottky plot based on a C-V graph obtained by C-V measurement., The intensity of I mW/cm$^2$ is not particularly limited. For example, it is preferably 10 to 200 mW/cm$^2$. The time of T hour/hours is not particularly limited, either. For example, it is preferably one to seven hours.

Specifically, the carrier density of the organic-inorganic perovskite compound can be adjusted to satisfy Formula (1) above by, for example, a method involving making the organic-inorganic perovskite compound a crystalline semiconductor having a degree of crystallinity of 70% or higher, and incorporating a part containing at least one element selected from the group consisting of an element of group 2 of the periodic table, an element of group 11 of the periodic table, manganese, antimony, titanium, neodymium, iridium, and lanthanum into the photoelectric conversion layer.

The present invention also encompasses a solar cell including an electrode; a counter electrode; and a photoelectric conversion layer between the electrode and the counter electrode, the photoelectric conversion layer containing an organic-inorganic perovskite compound represented by the formula R-M-X$_3$ where R is an organic molecule, M is a metal atom, and X is a halogen atom or a chalcogen atom, the organic-inorganic perovskite compound being an crystalline semiconductor having a degree of crystallinity of 70% or higher, the photoelectric conversion layer having a part containing at least one element selected from the group consisting of an element of group 2 of the periodic table, an element of group 11 of the periodic table, manganese, antimony, titanium, neodymium, iridium, and lanthanum.

When the organic-inorganic perovskite compound is a crystalline semiconductor, the carrier density of the organic-inorganic perovskite compound easily satisfies Formula (1) above, thus reducing a decrease in the photoelectric conversion efficiency due to continuous exposure of the solar cell to light (photodegradation), in particular photodegradation due to a decrease in the short-circuit current. In addition, when the organic-inorganic perovskite compound is a crystalline semiconductor, the mobility of electrons in the organic-inorganic perovskite compound is enhanced, improving the photoelectric conversion efficiency of the solar cell.

The crystalline semiconductor as used herein means a semiconductor whose scattering peak can be detected by the measurement of X-ray scattering intensity distribution.

The degree of crystallinity can be evaluated as an index of crystallization. The degree of crystallinity can be determined by separating a crystalline substance-derived scattering peak from an amorphous portion-derived halo, which are detected by X-ray scattering intensity distribution measurement, by fitting, determining their respective intensity integrals, and calculating the ratio of the crystalline portion to the whole.

When the degree of crystallinity of the organic-inorganic perovskite compound is 70% or higher, the carrier density of the organic-inorganic perovskite compound easily satisfies Formula (1) above, thus reducing a decrease in the photoelectric conversion efficiency due to continuous exposure of the solar cell to light (photodegradation), in particular photodegradation due to a decrease in the short-circuit current. In addition, the mobility of electrons in the organic-inorganic perovskite compound is enhanced, improving the photoelectric conversion efficiency of the solar cell. The lower limit of the degree of crystallinity is preferably 80%, more preferably 90%.

As another index of crystallization, the crystallite size may also be evaluated. The crystallite size can be calculated by the Halder-Wagner method from the half width of a crystalline substance-derived scattering peak detected by X-ray scattering intensity distribution measurement.

When the organic-inorganic perovskite compound has a crystallite size of 5 nm or greater, the carrier density of the organic-inorganic perovskite compound easily satisfies Formula (1) above, thus reducing a decrease in the photoelectric conversion efficiency due to continuous exposure of the solar cell to light (photodegradation), in particular photodegradation due to a decrease in short-circuit current. In addition, the mobility of electrons in the organic-inorganic perovskite compound is enhanced, improving the photoelectric conversion efficiency of the solar cell. The lower limit of the crystallite size is preferably 10 nm, more preferably 20 nm.

The degree of crystallinity and the crystallite size of the organic-inorganic perovskite compound can be increased by, for example, heat annealing (heat treatment), exposure to light having strong intensity such as laser, or plasma irradiation.

When heat annealing (heat treatment) is performed, the organic-inorganic perovskite compound may be heated at any temperature. Preferably, the heating temperature is 100° C. or higher but lower than 200° C. When the heating temperature is 100° C. or higher, the degree of crystallinity and crystallite size of the organic-inorganic perovskite compound can be sufficiently increased. When the heating temperature is lower than 200° C., the organic-inorganic perovskite compound can be heat-treated without being thermally degraded. The heating temperature is more preferably 120° C. or higher but 170° C. or lower. The heating time is not particularly limited. Preferably, the heating time is three minutes or longer but within two hours. When the heating time is three minutes or longer, the degree of crystallinity and crystallite size of the organic-inorganic perovskite compound can be sufficiently increased. When the heating time is within two hours, the organic-inorganic perovskite compound can be heat-treated without being thermally degraded. It is to be noted that the thermal degradation of the organic-inorganic perovskite compound breaks its crystalline structure.

These heating procedures are preferably performed under vacuum or inert gas. The dew-point temperature is preferably 10° C. or lower, more preferably 7.5° C. or lower, still more preferably 5° C. or lower.

When the photoelectric conversion layer has a part containing at least one element selected from the group consisting of an element of group 2 of the periodic table, an element of group 11 of the periodic table, antimony, manganese, neodymium, iridium, titanium, and lanthanum in addition to the organic-inorganic perovskite compound, the carrier density of the organic-inorganic perovskite compound easily satisfies Formula (1) above, thus reducing a decrease in the photoelectric conversion efficiency due to continuous exposure of the solar cell to light (photodegradation), in particular photodegradation due to a decrease in the short-circuit current and the fill factor.

Specific examples of the at least one element selected from the group consisting of an element of group 2 of the periodic table, an element of group 11 of the periodic table, antimony, manganese, neodymium, iridium, and titanium include calcium, strontium, silver, copper, antimony, manganese, neodymium, iridium, titanium, and lanthanum. In particular, calcium, strontium, silver, copper, neodymium, and iridium are preferred because they make it easy to satisfy Formula (1) above. From the standpoint of also enhancing the initial conversion efficiency, calcium, strontium, silver, copper, manganese, and lanthanum are more preferred, with calcium, strontium, silver, and copper being particularly preferred.

The content ratio (mol) of the at least one element selected from the group consisting of an element of group 2 of the periodic table, an element of group 11 of the periodic table, antimony, manganese, neodymium, iridium, titanium, and lanthanum is not particularly limited. The lower limit of the content ratio (mol) of the element relative to 100 of the metal element (M in $R-M-X_3$) in the organic-inorganic perovskite compound is preferably 0.01, and the upper limit thereof is preferably 20. A content ratio (mol) of the element of 0.01 or more reduces a decrease in the photoelectric conversion efficiency due to continuous exposure of the solar cell to light (photodegradation), in particular photodegradation due to a decrease in short-circuit current and the fill factor. A content ratio (mol) of the element of 20 or less can reduce a decrease in the initial conversion efficiency due to the presence of the element. The lower limit of the content ratio (mol) is more preferably 0.1, the upper limit thereof is more preferably 10.

The at least one element selected from the group consisting of an element of group 2 of the periodic table, an element of group 11 of the periodic table, antimony, manganese, neodymium, iridium, titanium, and lanthanum can be incorporated into the organic-inorganic perovskite compound by any method. For example, a halide of the element is mixed in a solution to be used for forming the layer of the organic-inorganic perovskite compound.

The carrier density of the organic-inorganic perovskite compound can be adjusted to satisfy Formula (1) above also by reducing the amount of an amine compound to a certain level or less in the photoelectric conversion layer.

The organic-inorganic perovskite compound is typically prepared by reaction of a metal halide compound and an amine compound. The resulting organic-inorganic perovskite compound contains components such as a residual amine compound that has failed to react in the reaction step for forming the organic-inorganic perovskite compound. Such a residual amine compound decreases the short-circuit current, thus contributing to the decrease in the photoelectric conversion efficiency due to continuous exposure of the solar cell to light (photodegradation). When the residual amine compound content relative to 1 mol of the organic-inorganic perovskite compound in the photoelectric conversion layer is 0.5 mol or less, the adverse effects caused by the residual amine compound can be reduced, and the carrier density of the organic-inorganic perovskite compound can be adjusted to satisfy Formula (1) above. The upper limit of the residual amine compound content is preferably 0.3 mol, more preferably 0.1 mol, most preferably 0.05 mol.

The present invention also encompasses a solar cell, including: an electrode; a counter electrode; and a photoelectric conversion layer between the electrode and the counter electrode, the photoelectric conversion layer containing an organic-inorganic perovskite compound represented by the formula $R-M-X_3$ where R is an organic molecule, M is a metal atom, and X is a halogen atom or a chalcogen atom, the organic-inorganic perovskite compound being a reaction product of a metal halide compound and an amine compound, the photoelectric conversion layer having a residual amine compound content of 0.5 mol or less relative to 1 mol of the organic-inorganic perovskite compound.

Specifically, the residual amine compound content in the photoelectric conversion layer may be adjusted within the above range by adjusting the concentration of a solution containing the metal halide compound and that of a solution containing the amine compound when the metal halide compound and the amine compound as raw materials are allowed to react to prepare the organic-inorganic perovskite compound. Alternatively, the residual amine compound content may be adjusted within the range by immersing the photoelectric conversion layer into a solvent that does not dissolve the organic-inorganic perovskite compound but dissolves the amine compound to reduce the residual amine compound. Preferred among these methods is the immersion of the photoelectric conversion layer into a solvent that does not dissolve the organic-inorganic perovskite compound but dissolves the amine compound to reduce the residual amine compound.

The metal halide compound as a raw material constitutes the metal atom M and the halogen atom X in the organic-inorganic perovskite compound. The metal halide compound thus may be, for example, a compound containing the metal atom M and the halogen atom X. Specific examples of such a compound include lead iodide, lead bromide, lead chloride, tin iodide, tin bromide, and tin chloride. These metal halide compounds may be used alone or in combination of two or more thereof.

The amine compound as a raw material constitutes the organic molecule R and the halogen atom X in the organic-inorganic perovskite compound. The amine compound thus may be a compound containing the organic molecule R and the halogen atom X. Specific examples of such a compound include methylammonium iodide, methylammonium bromide, methylammonium chloride, formamidinium iodide, formamidinium bromide, formamidinium chloride, guanidine iodide, guanidine bromide, and guanidine chloride. These amine compounds may be used alone or in combination of two or more thereof. The halogen atom X in the amine compound may be the same as or different from the halogen atom X in the metal halide compound.

These metal halide compounds and the amine compounds may appropriately be combined according to the structure of the desired organic-inorganic perovskite compound.

The residual amine compound content in the photoelectric conversion layer can be measured by, for example, the following method. The solar cell is first washed with a solvent that elutes only the amine compound, such as propanol, and the amine compound or the halogen element of the amine compound contained in the wash solution is quantified by gas chromatography-mass spectrometry (GCMS) (e.g., available from JEOL Ltd.). Alternatively, a wash solution is obtained in the same manner as above, and its solvent is replaced with pure water, followed by elemental analysis by ion chromatography (e.g., available from Dionex Corp.). These procedures detect the amount of the residual amine compound. Thereafter, the photoelectric conversion layer is washed with a solvent that elutes the organic-inorganic perovskite compound, such as DMF. The organic-inorganic perovskite compound contained in the wash solution is quantified by detecting a metal element peak by Rutherford backscattering spectrometry (RBS), whereby detecting the amount of the organic-inorganic perovskite compound.

The above describes the method of adjusting the degree of crystallinity of the organic-inorganic perovskite compound to 70% or higher or adjusting the crystallite size to 5 nm or greater, and incorporating a part containing at least one element selected from the group consisting of an element of group 2 of the periodic table, an element of group 11 of the periodic table, manganese, antimony, titanium, neodymium, iridium, and lanthanum into the photoelectric conversion layer, and describes the method of reducing the residual amine compound content in the photoelectric conversion layer to a certain level or less. These methods may be used alone or in combination.

The photoelectric conversion layer may further include an organic semiconductor or an inorganic semiconductor, in addition to the organic-inorganic perovskite compound, without impairing the effects of the present invention. In this context, the organic semiconductor or the inorganic semiconductor may play a role as an electron transport layer or a hole transport layer mentioned later.

Examples of the organic semiconductor include compounds having a thiophene skeleton, such as poly(3-alkylthiophene). Examples thereof also include conductive polymers having a poly-p-phenylenevinylene skeleton, a polyvinylcarbazole skeleton, a polyaniline skeleton, a polyacetylene skeleton or the like. Examples thereof further include: compounds having a phthalocyanine skeleton, a naphthalocyanine skeleton, a pentacene skeleton, a porphyrin skeleton such as a benzoporphyrin skeleton, a spirobifluorene skeleton or the like; and carbon-containing materials such as carbon nanotube, graphene, and fullerene, which may be surface-modified.

Examples of the inorganic semiconductor include titanium oxide, zinc oxide, indium oxide, tin oxide, gallium oxide, tin sulfide, indium sulfide, zinc sulfide, CuSCN, $Cu_2O$, CuI, $MoO_3$, $V_2O_5$, $WO_3$, $MoS_2$, $MoSe_2$, and $Cu_2S$.

The photoelectric conversion layer including the organic semiconductor or the inorganic semiconductor in addition to the organic-inorganic perovskite compound may be a laminate where a thin film-shaped organic semiconductor or inorganic semiconductor part and a thin film-shaped organic-inorganic perovskite compound part are laminated, or may be a composite film where an organic semiconductor or inorganic semiconductor part and an organic-inorganic perovskite compound part are combined. The laminate is preferred from the viewpoint that the production process is simple. The composite film is preferred from the viewpoint that the charge separation efficiency of the organic semiconductor or the inorganic semiconductor can be improved.

The lower limit of the thickness of the thin film-shaped organic-inorganic perovskite compound part is preferably 5 nm, and the upper limit thereof is preferably 5,000 nm. When the thickness is 5 nm or greater, light can be sufficiently absorbed, enhancing the photoelectric conversion efficiency. When the thickness is 5,000 nm or smaller, the presence of a region in which charge separation cannot be achieved can be avoided, leading to higher photoelectric conversion efficiency. The lower limit of the thickness is more preferably 10 nm, and the upper limit thereof is more preferably 1,000 nm. The lower limit of the thickness is still more preferably 20 nm, and the upper limit thereof is still more preferably 500 nm.

When the photoelectric conversion layer is a composite film where an organic semiconductor or inorganic semiconductor part and an organic-inorganic perovskite compound part are combined, the lower limit of the thickness of the composite film is preferably 30 nm, and the upper limit thereof is preferably 3,000 nm. When the thickness is 30 nm or greater, light can be sufficiently absorbed, enhancing the photoelectric conversion efficiency. When the thickness is 3,000 nm or smaller, charge easily arrives at the electrode, enhancing the photoelectric conversion efficiency. The lower limit of the thickness is more preferably 40 nm, and the upper limit thereof is more preferably 2,000 nm. The lower limit of the thickness is still more preferably 50 nm, and the upper limit thereof is still more preferably 1,000 nm.

In the solar cell of the present invention, an electron transport layer may be disposed between the electrode and the photoelectric conversion layer.

Examples of the material for the electron transport layer include, but are not particularly limited to, N-type conductive polymers, N-type low-molecular organic semiconductors, N-type metal oxides, N-type metal sulfides, alkali metal halides, alkali metals, and surfactants. Specific examples thereof include cyano group-containing polyphenylenevinylene, boron-containing polymers, bathocuproine, bathophenanthroline, hydroxyquinolinatoaluminum, oxadiazole compounds, benzimidazole compounds, naphthalenetetracarboxylic acid compounds, perylene derivatives, phosphine oxide compounds, phosphine sulfide compounds, fluoro group-containing phthalocyanine, titanium oxide, zinc oxide, indium oxide, tin oxide, gallium oxide, tin sulfide, indium sulfide, and zinc sulfide.

The electron transport layer may consist only of a thin film-shaped electron transport layer (buffer layer), and preferably includes a porous electron transport layer. In particular, when the photoelectric conversion layer is a composite film where an organic semiconductor or inorganic semiconductor part and an organic-inorganic perovskite compound part are combined, the composite film is preferably formed on a porous electron transport layer because a more complicated composite film (more intricate structure) is obtained, enhancing the photoelectric conversion efficiency.

The lower limit of the thickness of the electron transport layer is preferably 1 nm, and the upper limit thereof is preferably 2,000 nm. When the thickness is 1 nm or greater, holes can be sufficiently blocked. When the thickness is 2,000 nm or smaller, the layer is less likely to be resistance to electron transport, enhancing the photoelectric conversion efficiency. The lower limit of the thickness of the electron transport layer is more preferably 3 nm, and the upper limit thereof is more preferably 1,000 nm. The lower limit of the thickness is still more preferably 5 nm, and the upper limit thereof is still more preferably 500 nm.

In the solar cell of the present invention, a material of a hole transport layer may be laminated between the photoelectric conversion layer and the counter electrode.

Examples of the material of the hole transport layer include, but are not particularly limited to, P-type conductive polymers, P-type low-molecular organic semiconductors, P-type metal oxides, P-type metal sulfides, and surfactants. Specific examples thereof include compounds having a thiophene skeleton, such as poly(3-alkylthiophene). Examples of the material also include conductive polymers having a triphenylamine skeleton, a polyparaphenylene vinylene skeleton, a polyvinyl carbazole skeleton, a polyaniline skeleton, or a polyacetylene skeleton. Examples of the material also include compounds having a phthalocyanine skeleton, a naphthalocyanine skeleton, a pentacene skeleton, a porphyrin skeleton (e.g., benzoporphyrin skeleton), or a spirobifluorene skeleton, molybdenum oxide, vanadium oxide, tungsten oxide, nickel oxide, copper oxide, tin oxide, molybdenum sulfide, tungsten sulfide, copper sulfide, tin sulfide, fluoro group-containing phosphonic acid, carbonyl-group containing phosphonic acid, copper compounds such as CuSCN and CuI, and carbon-containing materials such as carbon nanotube and graphene.

The material of the hole transport layer may be partly immersed in the photoelectric conversion layer, or disposed in the shape of a thin film on the photoelectric conversion layer. When the material of the hole transport layer is present in the shape of a thin film, the lower limit of its thickness is preferably 1 nm, and the upper limit thereof is preferably 2,000 nm. When the thickness is 1 nm or greater, electrons can be sufficiently blocked. When the thickness is 2,000 nm or smaller, the layer is less likely to be resistance to hole transport, enhancing the photoelectric conversion efficiency. The lower limit of the thickness is more preferably 3 nm, and the upper limit thereof is more preferably 1,000 nm. The lower limit of the thickness is still more preferably 5 nm, and the upper limit thereof is still more preferably 500 nm.

The solar cell of the present invention may further have a substrate or the like. Examples of the substrate include, but are not particularly limited to, transparent glass substrates such as soda lime glass and alkali-free glass substrates, ceramic substrates, metal substrates, and transparent plastic substrates.

In the solar cell of the present invention, the above-described laminate, in which the electrode, the electron transport layer (if necessary), the photoelectric conversion layer, the hole transport layer (if necessary), and the counter electrode are formed on the substrate (disposed if necessary), may be encapsulated with an encapsulation material. The encapsulation material is not particularly limited as long as it has barrier properties. Examples thereof include thermosetting resins, thermoplastic resins, and inorganic materials.

Examples of the thermosetting resins and thermoplastic resins include epoxy resin, acrylic resin, silicon resin, phenol resin, melamine resin, urea resin, butyl rubber, polyester, polyurethane, polyethylene, polypropylene, polyvinyl chloride, polystyrene, polyvinyl alcohol, polyvinyl acetate, ABS resin, polybutadiene, polyamide, polycarbonate, polyimide, and polyisobutylene.

When the encapsulation material is a thermosetting resin or a thermoplastic resin, the lower limit of the thickness of the encapsulation layer (resin layer) is preferably 100 nm, and the upper limit thereof is preferably 100,000 nm. The lower limit of the thickness is more preferably 500 nm, and the upper limit thereof is more preferably 50,000 nm. The lower limit is still more preferably 1,000 nm, and the upper limit is still more preferably 20,000 nm.

Examples of the inorganic material include an oxide, a nitride, or an oxynitride of Si, Al, Zn, Sn, In, Ti, Mg, Zr, Ni, Ta, W, Cu, or an alloy containing two or more of them. In particular, an oxide, a nitride, or an oxynitride of metal elements including both of the metal elements Zn and Sn is preferred because water vapor barrier property and plasticity can be imparted to the encapsulation material.

When the encapsulation material is an inorganic material, the lower limit of the thickness of the encapsulation layer (inorganic layer) is preferably 30 nm, and the upper limit thereof is preferably 3,000 nm. When the thickness is 30 nm or greater, the inorganic layer can have an adequate water vapor barrier property, improving the durability of the solar cell. When the thickness is 3,000 nm or smaller, only small stress is generated even when the thickness of the inorganic layer is increased. Therefore, separation of the inorganic layer and the laminate can be suppressed. The lower limit of the thickness is more preferably 50 nm, and the upper limit thereof is more preferably 1,000 nm. The lower limit of the thickness is still more preferably 100 nm, and the upper limit thereof is still more preferably 500 nm.

The thickness of the inorganic layer can be measured using an optical interference-type film thickness measurement apparatus (e.g., FE-3000 available from Otsuka Electronics Co., Ltd.).

The encapsulation of the laminate with the thermosetting resin and the thermoplastic resin, among the above encapsulation materials, may be performed by any method. Examples of the method include a method which involves sealing the laminate using a sheet-shaped encapsulation material, a method which involves applying an encapsulation material solution containing the encapsulation material dissolved in an organic solvent to the laminate, a method which involves applying a liquid monomer that serves as the encapsulation material to the laminate, followed by cross-linking or polymerization of the liquid monomer using heat, UV, or the like, and a method which involves melting the encapsulation material under heat, followed by cooling.

Preferred methods for covering the laminate with the inorganic material, among the encapsulation materials, are a vacuum deposition method, a sputtering method, a chemical vapor deposition (CVD) method, and an ion plating method. In particular, a sputtering method is preferred for the formation of a dense layer, and a DC magnetron sputtering method is more preferred among sputtering methods.

In the sputtering method, the inorganic layer containing the inorganic material can be formed by depositing raw materials including a metal target and oxygen gas or nitrogen gas on the laminate for film formation.

The encapsulation material may be a combination of the thermosetting resin and thermoplastic resin with the inorganic material.

In the solar cell of the present invention, the encapsulation material may be covered with an additional material such as a glass sheet, resin film, inorganic material-coated resin film, or metal foil. Specifically, the solar cell of the present invention may be configured such that encapsulation, filling, or bonding between the laminate and the additional material is attained by the encapsulation material. This configuration enables sufficient blocking of water vapor even when a pinhole is present in the encapsulation material, and can further improve the durability of the solar cell.

The solar cell of the present invention may be produced by any method. For example, the solar cell can be produced by forming the electrode, the electron transport layer (if necessary), the photoelectric conversion layer, the hole transport layer (if necessary), and the counter electrode in the stated order on the substrate (disposed if necessary) to prepare the laminate and then encapsulating the laminate with the encapsulation material.

For the formation of the photoelectric conversion layer, the metal halide compound and the amine compound are allowed to react to form a photoelectric conversion layer containing the organic-inorganic perovskite compound.

The reaction of the metal halide compound and the amine compound may be performed by any method. The reaction may be performed by a method such as a chemical vapor deposition (CVD) method or an electrochemical deposition method. Preferably, the reaction is performed by a printing method using a solution containing the metal halide compound and a solution containing the amine compound. Specifically, the substrate (if necessary, the substrate has the electrode and the electron transport layer thereon) is immersed into these solutions, or these solutions may be applied to the substrate. In such cases, the solution containing the amine compound may be applied after the film of the metal halide compound is formed. The solution containing the metal halide compound and the solution containing the amine compound may be mixed in advance and the substrate (if necessary, the substrate has the electrode and the electron transport layer thereon) may be immersed into the mixture. Alternatively, the solution containing the metal halide compound and the solution containing the amine compound may be mixed in advance and the mixture may be applied to the substrate.

The employment of a printing method enables simple formation of a large-area solar cell that can exhibit high photoelectric conversion efficiency. Examples of the printing method include a spin coating method and a casting method. Examples of the method using the printing method include a roll-to-roll method.

When at least one element selected from the group consisting of an element of group 2 of the periodic table, an element of group 11 of the periodic table, manganese, antimony, titanium, neodymium, iridium, and lanthanum is incorporated into the photoelectric conversion layer, the element is added to one or both of the solution containing the metal halide compound and the solution containing the amine compound.

When the organic-inorganic perovskite compound is made a crystalline semiconductor, it is preferred to perform a step of heating the obtained photoelectric conversion layer after the formation of the photoelectric conversion layer. The step of heating the photoelectric conversion layer can efficiently remove the solvent and crystallize the organic-inorganic perovskite compound without degrading the solar cell.

The heating temperature in the step of heating the photoelectric conversion layer is preferably 100° C. or higher but lower than 200° C., more preferably 120° C. or higher but 170° C. or lower.

The heating time in the step of heating the photoelectric conversion layer is not particularly limited. The heating time is preferably three minutes or longer within two hours, for avoiding the thermal degradation of the organic-inorganic perovskite compound.

The heating in the step of heating the photoelectric conversion layer is preferably performed under vacuum or an inert gas. The dew-point temperature is preferably 10° C. or lower, more preferably 7.5° C. or lower, still more preferably 5° C. or lower.

The step of heating the photoelectric conversion layer may be performed immediately after the formation of the photoelectric conversion layer; however, in cases where an additional step of reducing residual amine compound in the photoelectric conversion layer (described later) is performed, the residual amine compound can be reduced more efficiently by performing the heating step after this additional step.

The present invention also encompasses a method of producing a solar cell including an electrode, a counter electrode, and a photoelectric conversion layer between the electrode and the counter electrode, the photoelectric conversion layer containing an organic-inorganic perovskite compound represented by the formula $R-M-X_3$ where R is an organic molecule, M is a metal atom, and X is a halogen atom or a chalcogen atom, the method including the steps of: forming a photoelectric conversion layer containing an organic-inorganic perovskite compound by a printing method using a solution containing a metal halide compound and a solution containing an amine compound; and heating the photoelectric conversion layer under conditions of a heating temperature of 100° C. or higher but lower than 200° C. and a heating time of three minutes or longer but within two hours, the method including incorporating, into one or both of the solution containing a metal halide compound and the solution containing an amine compound, at least one element selected from the group consisting of an element of group 2 of the periodic table, an element of group 11 of the periodic table, manganese, antimony, titanium, neodymium, iridium, and lanthanum.

In the case of reducing the residual amine compound in the photoelectric conversion layer, a step of reducing the residual amine compound in the photoelectric conversion layer is performed.

The step of reducing the residual amine compound in the photoelectric conversion layer may be performed by, for example, immersing the photoelectric conversion layer into a solvent that does not dissolve the organic-inorganic perovskite compound but dissolves the amine compound. The immersion of the photoelectric conversion layer into such a solvent efficiently reduces the residual amine compound, thus adjusting the residual amine compound content within the above range.

The solvent that does not dissolve the organic-inorganic perovskite compound but dissolves the amine compound is appropriately selected according to the organic-inorganic perovskite compound and the amine compound. Such solvents can be used alone or in combination of two or more thereof. Since the solvent is preferably as free from water as possible, ethanol, 1-propanol, 2-propanol, butanol, and the like are preferred.

The temperature at which the photoelectric conversion layer is immersed into the solvent is not particularly limited, and is preferably 10° C. to 100° C., more preferably 15° C. to 80° C.

The time for which the photoelectric conversion layer is immersed into the solvent is not particularly limited, and is preferably one second or longer but one hour or shorter. Immersion for one second or longer can efficiently reduce the amine compound. Immersion of one hour or shorter can reduce the effects of a trace amount of water present in the solvent.

The present invention also encompasses a method of producing a solar cell including an electrode, a counter electrode, and a photoelectric conversion layer between the electrode and the counter electrode, the photoelectric conversion layer containing an organic-inorganic perovskite compound represented by the formula $R-M-X_3$ where R is an organic molecule, M is a metal atom, and X is a halogen atom or a chalcogen atom, the method including the steps of: forming a photoelectric conversion layer containing an organic-inorganic perovskite compound by a printing method using a solution containing a metal halide compound and a solution containing an amine compound; and immersing the photoelectric conversion layer into a solvent that does not dissolve the organic-inorganic perovskite compound but dissolves the amine compound.

Advantageous Effects of Invention

The present invention provides a solar cell in which a decrease in photoelectric conversion efficiency due to continuous exposure to light (photodegradation) is reduced, and a method of producing the solar cell.

BRIEF DESCRIPTION OF DRAWINGS

FIG. 1 is a schematic view of an exemplary crystalline structure of an organic-inorganic perovskite compound.

DESCRIPTION OF EMBODIMENTS

Hereinafter, the present invention will be described in more detail with reference to Examples. However, the present invention is not intended to be limited by these Examples.

EXAMPLE 1

(1) Preparation of Titanium-Containing Coating Liquid

Ten millimoles of titanium powder was precisely weighed and put in a beaker. To the beaker were further added 40 g of aqueous hydrogen peroxide and 10 g of aqueous ammonia. The mixture was cooled with water for two hours before adding 30 mmol of L-lactic acid. The mixture was then heated on a hot plate set at 80° C. for one day. To the mixture was then added 10 mL of distilled water, thus a titanium-containing coating liquid was prepared.

(2) Preparation of Solar Cell

A FTO film having a thickness of 1,000 nm as an electrode (cathode) was formed on a glass substrate, ultrasonically washed with pure water, acetone, and methanol each for 10 minutes in the stated order, and then dried.

The titanium-containing coating liquid was applied at 1,500 rpm by the spin coating method and then fired in air at 550° C. for 10 minutes to form a thin film-shaped electron transport layer. Onto the thin film-shaped electron transport layer was applied titanium oxide paste containing polyisobutyl methacrylate as an organic binder and titanium oxide (mixture of powders with an average particle sizes of 10 nm and 30 nm) by the spin coating method. The paste was then fired at 500° C. for 10 minutes to form a porous electron transport layer having a thickness of 300 nm.

Subsequently, lead iodide as a metal halide compound was dissolved into N,N-dimethylformamide (DMF) to prepare a 1 M solution. In order to add copper, copper chloride as an additive was dissolved into the lead iodide solution in DMF to achieve a concentration of 0.01 M. The obtained solution was applied onto the porous electron transport layer by the spin coating method to form a film.

Separately, methylammonium iodide as an amine compound was dissolved into 2-propanol to prepare a 1 M solution. The sample with the above lead iodide film was immersed into this solution to form a layer containing CH$_3$NH$_3$PbI$_3$, which is an organic-inorganic perovskite compound. After immersion, the obtained sample was subjected to heat treatment at 80° C. for 30 minutes.

Further, 1 wt % solution of poly(4-butylphenyl-diphenylamine) (available from 1-Material) in chlorobenzene was applied onto the organic-inorganic perovskite compound part by the spin coating method to a thickness of 50 nm, thus forming a hole transport layer.

A gold film having a thickness of 100 nm was formed as a counter electrode (anode) on the obtained hole transport layer by vacuum deposition, whereby a solar cell was prepared.

(3) Measurement of Degree of Crystallinity and Crystallite Size of Organic-Inorganic Perovskite Compound The degree of crystallinity was determined by: separating a crystalline substance-derived scattering peak and an amorphous portion-derived halo by fitting in the region where 2θ is 13° to 15° in a spectrum detected by X-ray scattering intensity distribution measurement; determining their respective intensity integrals; and calculating the ratio of the crystalline portion to the whole. The crystallite size was calculated from the obtained spectrum by the Halder-Wagner method using data analysis software PDXL available from Rigaku Corporation.

(4) Measurement of Carrier Density of Organic-Inorganic Perovskite Compound

A C-V measurement was performed on the solar cell with an impedance analyzer (available from Solartron, S11287) while exposing the solar cell to artificial sunlight from HAL-320 (available from Asahi Spectra Co., Ltd.) at 100 mW/cm$^2$. The measurement was performed at a frequency of 1,000 Hz and at a scan rate of 100 mV/s from +2 V to −2 V. The carrier density N(0, I) of the organic-inorganic perovskite compound immediately after the start of exposure to light and the carrier density N(T, I) of the organic-inorganic perovskite compound after one-hour exposure to light were determined by conversion to the Mott-Schottky plot based on the C-V graph obtained by the C-V measurement, and N(T, I)/N(0, I) was calculated.

EXAMPLES 2 TO 14

A solar cell was obtained in the same manner as in Example 1 except that instead of 0.01 M of copper chloride of Example 1, the compound and the amount shown in Table 1 were employed in the preparation of the solution for organic-inorganic perovskite compound formation, and that the material of the hole transport layer was changed to that shown in Table 1. The properties of the organic-inorganic perovskite compound including the degree of crystallinity and carrier density were measured in the same manner as in Example 1.

EXAMPLES 15 AND 16

On the porous electron transport layer of Example 1, CH$_3$NH$_3$I and PbI$_2$ were dissolved at a mole ratio of 1:1 into N,N-dimethylformamide (DMF) as a solvent to achieve a Pb concentration of 1 M, thereby preparing a solution for organic-inorganic perovskite compound formation. In order to add strontium or titanium, strontium chloride or titanium iodide as an additive was dissolved into the thus prepared solution to a concentration of 0.01 M. The resulting solution was applied onto the above porous electron transport layer by the spin coating method to form a film. Further, 1 wt % solution of poly(4-butylphenyl-diphenyl-amine) (available from 1-Material) in chlorobenzene was applied onto the organic-inorganic perovskite compound part by the spin coating method to a thickness of 50 nm to form a hole transport layer, whereby a photoelectric conversion layer was formed. A gold film having a thickness of 100 nm was formed as a counter electrode (anode) on the photoelectric conversion layer by vacuum deposition, thus a solar cell was prepared.

EXAMPLE 17

On the porous electron transport layer of Example 1, CH$_3$NH$_3$I and PbCl$_2$ were dissolved at a mole ratio of 3:1 into N,N-dimethylformamide (DMF) as a solvent to achieve a Pb concentration of 1 M, thereby preparing a solution for organic-inorganic perovskite compound formation. In order to add strontium, strontium chloride as an additive was dissolved into the thus prepared solution to a concentration of 0.01 M. The resulting solution was applied onto the above porous electron transport layer by the spin coating method to form a film. Further, 1 wt % solution of poly(4-butylphenyl-diphenyl-amine) (available from 1-Material) in chlorobenzene was applied onto the organic-inorganic perovskite compound part by the spin coating method to a thickness of 50 nm to form a hole transport layer, whereby a photoelectric conversion layer was formed. A gold film having a thickness of 100 nm was formed as a counter electrode (anode) on the photoelectric conversion layer by vacuum deposition, thus a solar cell was prepared.

COMPARATIVE EXAMPLE 1

A solar cell was obtained in the same manner as in Example 1 except that no additive was used in the preparation of the solution for organic-inorganic perovskite compound formation. The properties of the organic-inorganic perovskite compound including the degree of crystallinity and carrier density were measured in the same manner as in Example 1.

COMPARATIVE EXAMPLE 2

A solar cell was obtained in the same manner as in Example 3 except that no additive was used in the preparation of the solution for organic-inorganic perovskite compound formation. The properties of the organic-inorganic perovskite compound including the degree of crystallinity and carrier density were measured in the same manner as in Example 1.

COMPARATIVE EXAMPLES 3 TO 7

A solar cell was obtained in the same manner as in Example 1 except that the type and concentration of the additives used in the preparation of the solution for organic-inorganic perovskite compound formation were changed as shown in Table 1. The properties of the organic-inorganic perovskite compound including the degree of crystallinity and carrier density were measured in the same manner as in Example 1.

COMPARATIVE EXAMPLE 8

A solar cell was obtained in the same manner as in Example 15 except that no additive was used in the preparation of the solution for organic-inorganic perovskite compound formation. The properties of the organic-inorganic perovskite compound including the degree of crystallinity and carrier density were measured in the same manner as in Example 1.

COMPARATIVE EXAMPLE 9

A solar cell was obtained in the same manner as in Example 17 except that no additive was used in the preparation of the solution for organic-inorganic perovskite compound formation. The properties of the organic-inorganic perovskite compound including the degree of crystallinity and carrier density were measured in the same manner as in Example 1.

COMPARATIVE EXAMPLE 10

A solar cell was obtained in the same manner as in Example 1 except that after the formation of the layer containing the organic-inorganic perovskite compound $CH_3NH_3PbI_3$, the obtained sample was heat-treated at 200° C. for 30 minutes. The properties of the organic-inorganic perovskite compound including the degree of crystallinity and carrier density were measured in the same manner as in Example 1.

<Evaluation>

The solar cells obtained in Examples 1 to 17 and Comparative Examples 1 to 9 were subjected to the following evaluations. Table 1 shows the results.

(1) Photodegradation Test

A power source (236 model, available from Keithley Instruments, Inc.) was connected between the electrodes in the solar cell. The solar cell was exposed to light at an intensity of 100 mW/cm² using a solar simulator (available from Yamashita Denso Corp.). The photoelectric conversion efficiency immediately after the start of exposure to light and the photoelectric conversion efficiency after one-hour exposure to light were measured. The value of photoelectric conversion efficiency after one-hour light exposure/photoelectric conversion efficiency immediately after the start of light exposure was calculated. A value of 0.9 or greater was rated "○○○ (Excellent)", a value of 0.8 or greater but smaller than 0.9 was rated "○○ (Very Good)", a value of 0.6 or greater but smaller than 0.8 was rated "○ (Good)", and a value of smaller than 0.6 was rated "× (Poor)".

(2) Initial Conversion Efficiency

A power source (236 model, available from Keithley Instruments, Inc.) was connected between the electrodes in the solar cell. The photoelectric conversion efficiency was measured by exposing the solar cell to light at an intensity of 100 mW/cm² using a solar simulator (available from Yamashita Denso Corp.). In Examples 1-14 and Comparative Examples 2-7, a photoconversion efficiency of 1 or greater was rated "○ (Good)" and a photoconversion efficiency of smaller than 1 was rated "× (Poor)" with the conversion efficiency of Comparative Example 1 normalized to 1. In Examples 15-16, a photoconversion efficiency of 1 or greater was rated "○ (Good)" and a photoconversion efficiency of smaller than 1 was rated "× (Poor)" with the conversion efficiency of Comparative Example 8 normalized to 1. In Example 17, a photoconversion efficiency of 1 or greater was rated "○ (Good)" and a photoconversion efficiency of smaller than 1 was rated "× (Poor)" with the conversion efficiency of Comparative Example 9 normalized to 1.

TABLE 1

| | | Photoelectric conversion layer | | | | | |
| --- | --- | --- | --- | --- | --- | --- | --- |
| | Electron transport layer | Organic-inorganic perovskite compound | Additive | Additive concentration | Degree of crystallinity (%) | Crystallite size (nm) | N(T, I)/N(0, I) |
| Example 1 | $TiO_2$ | $CH_3NH_3PbI_3$—Cu | CuCl | 1 mol % | 95 | 25 | 1.4 |
| Example 2 | $TiO_2$ | $CH_3NH_3PbI_3$—Cu | CuCl | 5 mol % | 98 | 26 | 1.3 |
| Example 3 | $TiO_2$ | $CH_3NH_3PbI_3$—Cu | CuCl | 1 mol % | 97 | 25 | 1.3 |
| Example 4 | $TiO_2$ | $CH_3NH_3PbI_3$—Ag | AgCl | 1 mol % | 95 | 25 | 1.3 |
| Example 5 | $TiO_2$ | $CH_3NH_3PbI_3$—Sr | $SrCl_2 \cdot 6H_2O$ | 1 mol % | 99 | 30 | 1.2 |
| Example 6 | $TiO_2$ | $CH_3NH_3PbI_3$—Sr | $SrI_2$ | 1 mol % | 97 | 28 | 1.3 |
| Example 7 | $TiO_2$ | $CH_3NH_3PbI_3$—Sr | $SrI_2$ | 5 mol % | 95 | 24 | 1.4 |
| Example 8 | $TiO_2$ | $CH_3NH_3PbI_3$—Ca | $CaCl_2$ | 1 mol % | 94 | 25 | 1.4 |
| Example 9 | $TiO_2$ | $CH_3NH_3PbI_3$—Nd | $NdCl_3$ | 1 mol % | 90 | 20 | 2.3 |
| Example 10 | $TiO_2$ | $CH_3NH_3PbI_3$—Ir | $IrCl_3$ | 1 mol % | 89 | 18 | 2.5 |
| Example 11 | $TiO_2$ | $CH_3NH_3PbI_3$—Ti | $TiI_4$ | 1 mol % | 86 | 10 | 3.2 |
| Example 12 | $TiO_2$ | $CH_3NH_3PbI_3$—Mn | $MnCl_2$ | 1 mol % | 88 | 15 | 3.3 |
| Example 13 | $TiO_2$ | $CH_3NH_3PbI_3$—Sb | $SbCl_3$ | 1 mol % | 85 | 11 | 4.5 |
| Example 14 | $TiO_2$ | $CH_3NH_3PbI_3$—La | $LaCl_3 \cdot 7H_2O$ | 1 mol % | 90 | 20 | 3.2 |
| Example 15 | $TiO_2$ | $CH_3NH_3PbI_3$—Sr | $SrCl_2 \cdot 6H_2O$ | 1 mol % | 93 | 24 | 1.8 |
| Example 16 | $TiO_2$ | $CH_3NH_3PbI_3$—Ti | $TiI_4$ | 1 mol % | 86 | 12 | 4.3 |
| Example 17 | $TiO_2$ | $CH_3NH_3Pb(I,Cl)_3$—Sr | $SrCl_2 \cdot 6H_2O$ | 1 mol % | 95 | 25 | 1.5 |
| Comparative Example 1 | $TiO_2$ | $CH_3NH_3PbI_3$ | — | — | — | — | 5.3 |
| Comparative Example 2 | $TiO_2$ | $CH_3NH_3PbI_3$ | — | — | — | — | 5.4 |
| Comparative Example 3 | $TiO_2$ | $CH_3NH_3PbI_3$—Bi | $BiCl_3$ | 1 mol % | — | — | 6.2 |
| Comparative Example 4 | $TiO_2$ | $CH_3NH_3PbI_3$—Zn | $ZnCl_2$ | 1 mol % | — | — | 5.7 |
| Comparative Example 5 | $TiO_2$ | $CH_3NH_3PbI_3$—Sc | $ScCl_3$ | 1 mol % | — | — | 5.6 |
| Comparative Example 6 | $TiO_2$ | $CH_3NH_3PbI_3$—Rh | $RhCl_3$ | 1 mol % | — | — | 5.3 |
| Comparative Example 7 | $TiO_2$ | $CH_3NH_3PbI_3$—Cs | CsCl | 1 mol % | — | — | 5.2 |
| Comparative Example 8 | $TiO_2$ | $CH_3NH_3PbI_3$ | — | — | — | — | 6.2 |
| Comparative Example 9 | $TiO_2$ | $CH_3NH_3Pb(I,Cl)_3$ | — | — | — | — | 5.8 |
| Comparative Example 10 | $TiO_2$ | $CH_3NH_3PbI_3$—Cu | CuCl | 1 mol % | 0 | 0 | 5.2 |

TABLE 1-continued

|  | Hole transport layer | Evaluation Photodegradation test | Initial conversion efficiency |
|---|---|---|---|
| Example 1 | Poly-TPD | ○○○ | ○ |
| Example 2 | Poly-TPD | ○○○ | ○ |
| Example 3 | Spiro-OMeTAD | ○○○ | ○ |
| Example 4 | Poly-TPD | ○○○ | ○ |
| Example 5 | Poly-TPD | ○○○ | ○ |
| Example 6 | Poly-TPD | ○○ | ○ |
| Example 7 | Poly-TPD | ○○ | ○ |
| Example 8 | Poly-TPD | ○○○ | ○ |
| Example 9 | Poly-TPD | ○○ | X |
| Example 10 | Poly-TPD | ○○ | X |
| Example 11 | Poly-TPD | ○ | ○ |
| Example 12 | Poly-TPD | ○ | ○ |
| Example 13 | Poly-TPD | ○ | ○ |
| Example 14 | Poly-TPD | ○○ | ○ |
| Example 15 | Poly-TPD | ○○○ | ○ |
| Example 16 | Poly-TPD | ○ | ○ |
| Example 17 | Poly-TPD | ○○○ | ○ |
| Comparative Example 1 | Poly-TPD | X | — |
| Comparative Example 2 | Spiro-OMeTAD | X | — |
| Comparative Example 3 | Poly-TPD | X | X |
| Comparative Example 4 | Poly-TPD | X | X |
| Comparative Example 5 | Poly-TPD | X | X |
| Comparative Example 6 | Poly-TPD | X | ○ |
| Comparative Example 7 | Poly-TPD | X | ○ |
| Comparative Example 8 | Poly-TPD | X | — |
| Comparative Example 9 | Poly-TPD | X | — |
| Comparative Example 10 | Poly-TPD | X | X |

EXAMPLE 18

(1) Preparation of Solar Cell

A FTO film having a thickness of 1,000 nm as an electrode (cathode) was formed on a glass substrate, ultrasonically washed with pure water, acetone, and methanol each for 10 minutes in the stated order, and then dried.

A titanium-containing coating liquid was applied at 1500 rpm by the spin coating method and then fired at 550° C. in air for 10 minutes to form a thin film-shaped electron transport layer. Onto the thin film-shaped electron transport layer was applied titanium oxide paste containing polyisobutyl methacrylate as an organic binder and titanium oxide (mixture of powders with an average particle sizes of 10 nm and 30 nm) by the spin coating method. The paste was then fired at 500° C. for 10 minutes to form a porous electron transport layer having a thickness of 300 nm.

Subsequently, lead iodide as a metal halide compound was dissolved into N,N-dimethylformamide (DMF) to prepare a 1 M solution. The solution was applied onto the titanium oxide layer by the spin coating method to form a film. Separately, a methylammonium iodide as an amine compound was dissolved into 2-propanol to prepare a 1 M solution. The sample with the above lead iodide film was immersed into this solution to form a layer containing $CH_3NH_3PbI_3$, which is an organic-inorganic perovskite compound. Further, the obtained layer was subjected to immersion treatment (washing treatment) in 2-propanol (solvent that dissolves methylammonium iodide) for 20 seconds. After the immersion treatment, the obtained sample was heat-treated at 150° C. for 30 minutes.

A solution containing 68 mM of Spiro-OMeTAD (having a spirobifluorene skeleton), 55 mM of tert-butylpyridine, and 9 mM of lithium bis(trifluoromethylsulfonyl)imide salt was applied onto the organic-inorganic perovskite compound part by the spin coating method to a thickness of 50 nm, thus forming a hole transport layer.

A gold film having a thickness of 100 nm was formed as a counter electrode (anode) on the obtained hole transport layer by vacuum deposition, whereby a solar cell was prepared.

(2) Measurement of Carrier Density of Organic-Inorganic Perovskite Compound

A C-V measurement was performed on the solar cell with an impedance analyzer (available from Solartron, S11287) while exposing the solar cell to artificial sunlight from HAL-320 (available from Asahi Spectra Co., Ltd.) at 100 mW/cm$^2$. The measurement was performed at a frequency of 1,000 Hz and at a scan rate of 100 mV/s from +2 V to −2 V. The carrier density N(0, I) of the organic-inorganic perovskite compound immediately after the start of light exposure and the carrier density N(T, I) of the organic-inorganic perovskite compound after one-hour light exposure were determined by conversion to the Mott-Schottky plot based on the C-V graph obtained by the C-V measurement, and N(T, I)/N(0, I) was calculated.

EXAMPLES 19 TO 21

A solar cell was obtained in the same manner as in Example 18 except that the heating temperature or heating time was changed in the heat treatment after the immersion treatment (washing treatment), or the heat treatment was not performed.

EXAMPLE 22

A solar cell was obtained in the same manner as in Example 18 except that formamidinium iodide was used instead of methylammonium iodide, and that the heating temperature or the heating time was changed in the heat treatment after the immersion treatment (washing treatment).

EXAMPLES 23 TO 25

A solar cell was obtained in the same manner as in Example 18 except that the time of the immersion treatment (washing treatment) in 2-propanol was changed so that the amount (residual amount) of the amine compound remaining in the layer containing an organic-inorganic perovskite compound was changed to the value shown in Table 2, and that the type of the metal halide compound and the amine compound was changed as shown in Table 2.

EXAMPLE 26

A solar cell was obtained in the same manner as in Example 18 except that ethanol was used instead of 2-propanol as the solvent for the immersion treatment (washing treatment).

COMPARATIVE EXAMPLE 11

A solar cell was obtained in the same manner as in Example 18 except that the immersion treatment (washing treatment) in 2-propanol (solvent that dissolves methylammonium iodide) was not performed after the formation of the layer containing $CH_3NH_3PbI_3$.

COMPARATIVE EXAMPLE 12

A solar cell was obtained in the same manner as in Comparative Example 11 except that the heat treatment after the immersion treatment (washing treatment) was not performed.

<Evaluation>

The solar cells obtained in Examples 18 to 26 and Comparative Examples 11 and 12 were evaluated for the following parameters. Table 2 shows the results.

(1) Initial Conversion Efficiency Evaluation

A power source (236 model, available from Keithley Instruments, Inc.) was connected between the electrodes in the solar cell. The solar cell was exposed to light at an intensity of 100 mW/cm$^2$ using a solar simulator (available from Yamashita Denso Corp.), and the photoelectric conversion efficiency immediately after the start of exposure to light was measured.

○ (Good): Photoelectric conversion efficiency of 10% or higher

Δ (Fair): Photoelectric conversion efficiency of lower than 10% but 7% or higher × (Poor): Photoelectric conversion efficiency of lower than 7%

(2) Photodegradation Test

A power source (236 model, available from Keithley Instruments, Inc.) was connected between the electrodes in the solar cell. The solar cell was exposed to light at an intensity of 100 mW/cm$^2$ using a solar simulator (available from Yamashita Denso Corp.). The open-circuit voltage and the short-circuit current immediately after the start of light exposure, and those after twenty-minute light exposure were measured. The value of open-circuit voltage after twenty-minute exposure to light/open-circuit voltage immediately after the start of exposure to light (relative open-circuit voltage), and the value of short-circuit current after twenty-minute light exposure/short-circuit current immediately after the start of light exposure (relative short-circuit current) were calculated.

(3) Measurement of Residual Amine Compound Content

After the completion of the photodegradation test, the solar cell was washed with 2-propanol (solvent that only elutes methylammonium iodide and formamidinium iodide). The wash solution was subjected to elemental analysis by gas chromatography-mass spectrometry (GCMS) (JMS-Q1050GC, available from JEOL Ltd.). Thereafter, the organic-inorganic hybrid compound was eluted with DMF, and the resulting wash solution was subjected to elemental analysis by the RBS method to determine the residual amine compound content (mol) relative to 1 mol of the organic-inorganic perovskite compound.

TABLE 2

| | | | Photoelectric conversion layer | | | | |
|---|---|---|---|---|---|---|---|
| | | Metal halide compound | Amine compound | Organic-inorganic perovskite compound | Solvent for immersion | Heat treatment Temperature(° C.)/ time (min) | Residual amine compound content (mol) | N(T, I)/ N(0, I) |
| Example 18 | Lead iodide | Methylammonium iodide | $CH_3NH_3PbI_3$ | 2-Propanol | 150/30 | 0.04 | 3.4 |
| Example 19 | Lead iodide | Methylammonium iodide | $CH_3NH_3PbI_3$ | 2-Propanol | 100/30 | 0.03 | 4.3 |
| Example 20 | Lead iodide | Methylammonium iodide | $CH_3NH_3PbI_3$ | 2-Propanol | 100/100 | 0.04 | 3.3 |
| Example 21 | Lead iodide | Methylammonium iodide | $CH_3NH_3PbI_3$ | 2-Propanol | No heat treatment | 0.03 | 4.5 |
| Example 22 | Lead iodide | Formamidinium iodide | $HC(NH_2)_2PbI_3$ | 2-Propanol | 125/30 | 0.03 | 2.5 |
| Example 23 | Lead iodide | Methylammonium iodide | $CH_3NH_3PbI_3$ | 2-Propanol | 150/30 | 0.1 | 3.4 |
| Example 24 | Lead iodide | Methylammonium iodide | $CH_3NH_3PbI_3$ | 2-Propanol | 150/30 | 0.28 | 3.4 |
| Example 25 | Lead iodide | Methylammonium iodide | $CH_3NH_3PbI_3$ | 2-Propanol | 150/30 | 0.5 | 4.1 |

TABLE 2-continued

| | | | | | | | |
|---|---|---|---|---|---|---|---|
| Example 26 | Lead iodide | Methylammonium iodide | $CH_3NH_3PbI_3$ | Ethanol | 150/30 | 0.05 | 3.4 |
| Comparative Example 11 | Lead iodide | Methylammonium iodide | $CH_3NH_3PbI_3$ | — | 150/30 | 0.8 | 5.2 |
| Comparative Example 12 | Lead iodide | Methylammonium iodide | $CH_3NH_3PbI_3$ | — | No heat treatment | 0.8 | 6.5 |

| | Evaluation | | |
|---|---|---|---|
| | Initial conversion efficiency | Photodegradation test (relative open-circuit voltage) | Photodegradation test (relative short-circuit current) |
| Example 18 | ○ | 0.95 | 0.9 |
| Example 19 | ○ | 0.96 | 0.85 |
| Example 20 | ○ | 0.95 | 0.87 |
| Example 21 | Δ | 0.92 | 0.6 |
| Example 22 | ○ | 0.97 | 0.95 |
| Example 23 | ○ | 0.94 | 0.9 |
| Example 24 | ○ | 0.88 | 0.89 |
| Example 25 | ○ | 0.82 | 0.86 |
| Example 26 | Δ | 0.95 | 0.89 |
| Comparative Example 11 | ○ | 0.5 | 0.84 |
| Comparative Example 12 | ○ | 0.5 | 0.55 |

INDUSTRIAL APPLICABILITY

The present invention provides a solar cell in which a decrease in photoelectric conversion efficiency due to continuous exposure to light (photodegradation) is reduced, and a method of producing the solar cell.

The invention claimed is:

1. A solar cell, comprising:
an electrode;
a counter electrode;
a photoelectric conversion layer between the electrode and the counter electrode;
an electron transport layer between the electrode and the photoelectric conversion layer; and
a hole transport layer between the photoelectric conversion layer and the counter electrode,
the photoelectric conversion layer containing a layer comprising an organic-inorganic perovskite compound represented by the formula $R-M-X_3$ where R is an organic molecule, M is a metal atom, and X is a halogen atom or a chalcogen atom, and at least one element selected from the group consisting of an element of group 11 of the periodic table, calcium, strontium, manganese, antimony, titanium, neodymium, iridium, and lanthanum,
the organic-inorganic perovskite compound being a crystalline semiconductor having a degree of crystallinity of 70% or higher,
wherein the photoelectric conversion layer is formed by a printing method using a solution containing a metal halide compound and a solution containing an amine compound, wherein the at least one element is incorporated into one or both of the solution containing a metal halide compound and the solution containing an amine compound, and
wherein a content ratio (mol) of the at least one element selected from the group consisting of an element of group 11 of the periodic table, calcium, strontium, manganese, antimony, titanium, neodymium, iridium, and lanthanum relative to 100 mol of the metal atom M in the organic-inorganic perovskite compound is 1 to 5.

2. A method of producing the solar cell according to claim 1,
the method comprising the steps of:
forming the photoelectric conversion layer containing the organic-inorganic perovskite compound by a printing method using a solution containing a metal halide compound and a solution containing an amine compound; and
heating the photoelectric conversion layer under conditions of a heating temperature of 100° C. or higher but lower than 200° C. and a heating time of three minutes or longer but within two hours,
the method including incorporating, into one or both of the solution containing a metal halide compound and the solution containing an amine compound, at least one element selected from the group consisting of an element of group 2 of the periodic table, an element of group 11 of the periodic table, manganese, antimony, titanium, neodymium, iridium, and lanthanum.

3. The solar cell according to claim 1,
wherein, in the organic-inorganic perovskite compound represented by the formula $R-M-X_3$, X is iodine or bromine.

4. The solar cell according to claim 1,
wherein, in the organic-inorganic perovskite compound represented by the formula $R-M-X_3$, R is formamidinium or an ion thereof.

5. The solar cell according to claim 1,
wherein, in the organic-inorganic perovskite compound represented by the formula $R-M-X_3$, M is lead or tin.

6. The solar cell according to claim 5,
wherein, in the organic-inorganic perovskite compound represented by the formula $R-M-X_3$, X is iodine or bromine.

7. The solar cell according to claim 6,
wherein, in the organic-inorganic perovskite compound represented by the formula $R-M-X_3$, R is formamidinium or an ion thereof.

* * * * *